(12) United States Patent
Sato et al.

(10) Patent No.: US 10,373,926 B2
(45) Date of Patent: Aug. 6, 2019

(54) ANISOTROPIC CONDUCTIVE FILM, METHOD FOR PRODUCING ANISOTROPIC CONDUCTIVE FILM, METHOD FOR PRODUCING CONNECTION BODY, AND CONNECTION METHOD

(71) Applicant: DEXERIALS CORPORATION, Tokyo (JP)

(72) Inventors: Kouichi Sato, Tochigi (JP); Yasushi Akutsu, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/926,210

(22) Filed: Mar. 20, 2018

(65) Prior Publication Data

US 2018/0218994 A1 Aug. 2, 2018

Related U.S. Application Data

(63) Continuation of application No. 14/428,582, filed as application No. PCT/JP2013/075024 on Sep. 17, 2013, now Pat. No. 9,960,139.

(30) Foreign Application Priority Data

Sep. 18, 2012 (JP) .................. 2012-203958
Sep. 13, 2013 (JP) .................. 2013-190904

(51) Int. Cl.
*G02F 1/1345* (2006.01)
*H01L 23/00* (2006.01)
(Continued)

(52) U.S. Cl.
CPC .............. *H01L 24/28* (2013.01); *B29C 59/02* (2013.01); *B29C 71/04* (2013.01); *B32B 3/08* (2013.01);
(Continued)

(58) Field of Classification Search
CPC ......... H01L 24/28; H01L 24/27; H01L 24/26; H01L 24/29; H01L 24/81; H01L 24/83;
(Continued)

(56) References Cited

U.S. PATENT DOCUMENTS 6,020,059 A 2/2000 Yamada et al.
2009/0239082 A1 9/2009 Fujita
2011/0223394 A1 9/2011 Daigaku et al.

FOREIGN PATENT DOCUMENTS

JP 2000-151084 A 5/2000
JP 2000-178511 A 6/2000
(Continued)

OTHER PUBLICATIONS

Dec. 10, 2013 International Search Report issued in International Patent Application No. PCT/JP2013/075024.
(Continued)

*Primary Examiner* — Catherine A. Simone
(74) *Attorney, Agent, or Firm* — Oliff PLC

(57) ABSTRACT

To reduce substrate warp occurring after connection an anisotropic conductive film is used. An anisotropic conductive film has: a first insulating adhesive layer; a second insulating adhesive layer; and a conductive particle-containing layer sandwiched by the first insulating adhesive layer and the second insulating adhesive layer and having conductive particles contained in an insulating adhesive, wherein air bubbles are contained between the conductive particle-containing layer and the first insulating adhesive layer, and, the conductive particle-containing layer, a portion thereof below the conductive particles and in contact with the second insulating adhesive layer has a lower degree of cure than other portions thereof.

20 Claims, 7 Drawing Sheets

(51) Int. Cl.

| | | |
|---|---|---|
| C09J 9/02 | (2006.01) | |
| B32B 7/12 | (2006.01) | |
| C09J 7/00 | (2018.01) | |
| C09J 7/10 | (2018.01) | |
| B29C 35/08 | (2006.01) | |
| B29C 59/02 | (2006.01) | |
| B29C 71/04 | (2006.01) | |
| B32B 3/30 | (2006.01) | |
| B32B 33/00 | (2006.01) | |
| B32B 27/08 | (2006.01) | |
| B32B 27/20 | (2006.01) | |
| B32B 27/30 | (2006.01) | |
| B32B 27/36 | (2006.01) | |
| B32B 27/38 | (2006.01) | |
| B32B 3/08 | (2006.01) | |
| C08K 3/08 | (2006.01) | |
| B29K 63/00 | (2006.01) | |
| B29L 9/00 | (2006.01) | |
| B29L 31/34 | (2006.01) | |

(52) U.S. Cl.
CPC .............. *B32B 3/30* (2013.01); *B32B 7/12* (2013.01); *B32B 27/08* (2013.01); *B32B 27/20* (2013.01); *B32B 27/308* (2013.01); *B32B 27/36* (2013.01); *B32B 27/38* (2013.01); *B32B 33/00* (2013.01); *C09J 7/00* (2013.01); *C09J 7/10* (2018.01); *C09J 9/02* (2013.01); *G02F 1/13452* (2013.01); *G02F 1/13454* (2013.01); *H01L 24/27* (2013.01); *H01L 24/29* (2013.01); *H01L 24/81* (2013.01); *H01L 24/83* (2013.01); *B29C 2035/0827* (2013.01); *B29C 2059/028* (2013.01); *B29K 2063/00* (2013.01); *B29L 2009/003* (2013.01); *B29L 2031/34* (2013.01); *B32B 2255/205* (2013.01); *B32B 2264/102* (2013.01); *B32B 2264/104* (2013.01); *B32B 2270/00* (2013.01); *B32B 2307/202* (2013.01); *B32B 2307/412* (2013.01); *B32B 2307/706* (2013.01); *B32B 2457/00* (2013.01); *B32B 2457/202* (2013.01); *C08K 3/08* (2013.01); *C08K 2201/001* (2013.01); *C09J 2201/36* (2013.01); *C09J 2201/602* (2013.01); *C09J 2203/326* (2013.01); *C09J 2205/102* (2013.01); *H01L 24/13* (2013.01); *H01L 24/16* (2013.01); *H01L 24/32* (2013.01); *H01L 24/75* (2013.01); *H01L 2224/13144* (2013.01); *H01L 2224/16227* (2013.01); *H01L 2224/271* (2013.01); *H01L 2224/27003* (2013.01); *H01L 2224/2711* (2013.01); *H01L 2224/2712* (2013.01); *H01L 2224/27334* (2013.01); *H01L 2224/294* (2013.01); *H01L 2224/2908* (2013.01); *H01L 2224/2919* (2013.01); *H01L 2224/2929* (2013.01); *H01L 2224/2936* (2013.01); *H01L 2224/2939* (2013.01); *H01L 2224/29076* (2013.01); *H01L 2224/29083* (2013.01); *H01L 2224/29195* (2013.01); *H01L 2224/29311* (2013.01); *H01L 2224/29316* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29357* (2013.01); *H01L 2224/29371* (2013.01); *H01L 2224/29387* (2013.01); *H01L 2224/29388* (2013.01); *H01L 2224/29391* (2013.01); *H01L 2224/29393* (2013.01); *H01L 2224/29394* (2013.01); *H01L 2224/29395* (2013.01); *H01L 2224/29486* (2013.01); *H01L 2224/29494* (2013.01); *H01L 2224/29499* (2013.01); *H01L 2224/32225* (2013.01); *H01L 2224/73204* (2013.01); *H01L 2224/75301* (2013.01); *H01L 2224/81488* (2013.01); *H01L 2224/81903* (2013.01); *H01L 2224/83192* (2013.01); *H01L 2224/83203* (2013.01); *H01L 2224/83488* (2013.01); *H01L 2224/83851* (2013.01); *H01L 2224/83856* (2013.01); *H01L 2224/83862* (2013.01); *H01L 2224/83871* (2013.01); *H01L 2224/83874* (2013.01); *H01L 2224/83885* (2013.01); *H01L 2224/83907* (2013.01); *H01L 2924/0105* (2013.01); *H01L 2924/01006* (2013.01); *H01L 2924/01049* (2013.01); *H01L 2924/0543* (2013.01); *H01L 2924/0544* (2013.01); *H01L 2924/0549* (2013.01); *H01L 2924/07802* (2013.01); *H01L 2924/07811* (2013.01); *H01L 2924/351* (2013.01); *H01L 2924/3511* (2013.01); *H01L 2924/381* (2013.01); *Y10T 156/1039* (2015.01); *Y10T 428/24562* (2015.01)

(58) Field of Classification Search
CPC ...... C09J 7/10; C09J 9/02; B32B 7/12; B29C 71/04; B29C 59/02; G02F 1/13452; G02F 1/13454; Y10T 428/28; Y10T 428/24562
See application file for complete search history.

(56) References Cited

FOREIGN PATENT DOCUMENTS

| JP | 2003-195335 A | 7/2003 |
|---|---|---|
| JP | 2009-194359 A | 8/2009 |
| WO | 00/046315 A1 | 8/2000 |
| WO | 2006/093315 A1 | 9/2006 |
| WO | 2010/064358 A1 | 6/2010 |

OTHER PUBLICATIONS

Jun. 26, 2017 Office Action issued in U.S. Appl. No. 14/428,582.
Dec. 20, 2017 Notice of Allowance issued in U.S. Appl. No. 14/428,582.

ANISOTROPIC CONDUCTIVE FILM, METHOD FOR PRODUCING ANISOTROPIC CONDUCTIVE FILM, METHOD FOR PRODUCING CONNECTION BODY, AND CONNECTION METHOD

This application is a Continuation of application Ser. No. 14/428,582, filed Mar. 16, 2015, which is a National Stage of Application PCT/JP2013/075024, filed Sep. 17, 2013, and claims priority based on Japanese Patent Application No. 2012-203958, filed Sep. 18, 2012 and Japanese Patent Application No. 2013-190904, filed Sep. 13, 2013. The entire contents of the prior applications are hereby incorporated by reference herein in their entireties.

FIELD OF THE INVENTION

The present invention relates to an anisotropic conductive film for anisotropic conductive connection of electronic components, and particularly, relates to an anisotropic conductive film configured to reduce substrate warp occurring after connection of electronic components and to improve connection reliability, a method for producing an anisotropic conductive film, a method for producing a connection body, and a connection method.

BACKGROUND ART

Conventionally, liquid crystal display apparatuses have been widely used as various display means, such as televisions, PC monitors, cellular phones, tablet PCs, portable game machines, or in-vehicle monitors. In recent years, from the viewpoints of finer pitches, weight reduction and slimming down, and the like, into such liquid crystal display apparatuses, there have been employed what is called COG (chip on glass), the direct mounting of an IC for liquid crystal driving on a substrate of a liquid crystal display panel, and what is called FOG (film on glass), the direct mounting of a flexible substrate having a liquid crystal driving circuit formed therein on a substrate of a liquid crystal display panel.

For example, as illustrated in FIG. 10, a liquid crystal display apparatus 100 into which the COG mounting is adopted has a liquid crystal display panel 104 performing a main function for liquid crystal display, and this liquid crystal display panel 104 has two transparent substrates 102, 103 made of a glass substrate or the like and facing each other. Furthermore, in the liquid crystal display panel 104, these transparent substrates 102, 103 are stuck to each other via a frame seal 105, and provided is a panel display unit 107 in which liquid crystal 106 is sealed in a space surrounded with both of the transparent substrates 102, 103 and the seal 105.

On the internal surfaces of the transparent substrates 102, 103 facing each other, a pair of transparent electrodes 108, 109 made of ITO (indium tin oxide) or the like, having a stripe form are formed respectively in such a way as to intersect each other. Furthermore, both of the transparent substrates 102, 103 are configured to have a picture element as a minimum unit of liquid crystal display to be formed by the intersection portion of these transparent electrodes 108, 109.

Of the transparent substrates 102, 103, the one transparent substrate 103 is formed to have a larger plane size than the other transparent substrate 102, and, an edge portion 103a of the transparent substrate 103 thus formed larger is formed with a terminal portion 109a of the transparent electrode 109. In addition, on the transparent electrodes 108, 109, orientated films 111, 112 each undergoing a predetermined rubbing process are formed respectively, and the orientated films 111, 112 allow the initial orientation of liquid crystal molecules to be controlled. Furthermore, a pair of polarizing plates 118, 119 are provided on the outside of the transparent substrates 108, 109, respectively, and these polarizing plates 118, 119 is configured to allow the vibration direction of transmitted light from a light source 120 such as a backlight to be controlled.

On a terminal portion 109a, an IC for liquid crystal driving 115 is thermocompression-bonded via an anisotropic conductive film 114. The anisotropic conductive film 114 is obtained by mixing conductive particles into a thermosetting type binder resin and making the mixture into a film, and the thermocompression bonding of the anisotropic conductive film 114 between the two conductors allows electrical continuity between the conductors to be secured by the conductive particles, and mechanical connection between the conductors to be maintained by the binder resin. The IC for liquid crystal driving 115 is configured such that selective application of a liquid crystal driving voltage to the picture elements causes the orientation of liquid crystal to be partially changed, thereby allowing predetermined liquid crystal display to be achieved. It should be noted that, as an adhesive constituting the anisotropic conductive film 114, the most reliable thermosetting adhesive has been commonly used.

In the case where the IC for liquid crystal driving 115 is connected to the terminal portion 109a via such anisotropic conductive film 114, first, the anisotropic conductive film 114 is temporarily compression-bonded on the terminal portion 109a of the transparent electrode 109 by a not-illustrated temporary compression bonding means. Subsequently, the IC for liquid crystal driving 115 is disposed on the anisotropic conductive film 114, and then, as illustrated in FIG. 11, the thermocompression-bonding means 121 is made to generate heat, while the IC for liquid crystal driving 115 is pressed together with the anisotropic conductive film 114 toward the side of the terminal portion 109a by a thermocompression-bonding means 121 such as a thermocompression-bonding head. The heat generation by the thermocompression-bonding means 121 causes a thermosetting reaction of the anisotropic conductive film 114, whereby the IC for liquid crystal driving 115 is adhered onto the terminal portion 109a via the anisotropic conductive film 114.

PRIOR-ART DOCUMENTS

Patent Document

Patent document 1: Japanese Patent Application Laid-Open No. 2003-195335

SUMMARY OF THE INVENTION

Problems to be Solved by the Invention

Recently, there is a tendency toward the slimming down and weight reduction in display apparatuses, and accordingly, with size and weight reduction in the liquid crystal display apparatus 100 per se, there has been a growing demand for slimming down of the transparent substrates 102, 103 such as glass substrates.

Here, in the case where the IC for liquid crystal driving 115 is COG-mounted on the transparent substrate 103 which is to be used for the liquid crystal display panel 104, the warp of the transparent substrate 103 due to thermocompression is likely to occur due to reduction in a mounting area of the edge portion 103a of the transparent substrate 103 and slimming down of the transparent substrate 103. The occurrence of warp of the transparent substrate 103 causes color irregularities in a liquid crystal display around a COG mounting area.

This warp of the transparent substrate 103 is caused by a stress associated with cure shrinkage of an adhesive component of the anisotropic conductive film 114, and hence there can be mentioned a method of reducing the warp by adding a stress relaxation agent such as a rubber component into adhesive components. However, there is a risk that the addition of a stress relaxation agent causes reduction in the aggregation force of the adhesive components, thereby causing lower connection reliability and higher electrical continuity resistance.

Furthermore, also in the case of reducing the warp by changing the kind and the amount of the adhesive components, mounting conditions, and the like, there are additional various elements which need to be considered, such as maintenance of connection reliability, reduction in tact time, and the relaxation of thermal shock to an electronic component, such as the IC for liquid crystal driving 115, and therefore it is difficult to find out the optimal conditions.

Therefore, an object of the present invention is to provide an anisotropic conductive film capable of easily reducing warp occurring after connection of electronic components using the anisotropic conductive film in a process of connecting the electronic components, a method for producing an anisotropic conductive film, a method for producing a connection body, and a connection method.

Means to Solve the Problem

To solve the foregoing problems, an anisotropic conductive film according to the present invention comprises: a first insulating adhesive layer; a second insulating adhesive layer; and a conductive particle-containing layer sandwiched by the first insulating adhesive layer and the second insulating adhesive layer and having conductive particles contained in an insulating adhesive, wherein air bubbles are contained between the conductive particle-containing layer and the first insulating adhesive layer, and, in the conductive particle-containing layer, a portion thereof below the conductive particles and in contact with the second insulating adhesive layer has a lower degree of cure of the conductive particles than other portions thereof.

A method for producing an anisotropic conductive film according to the present invention comprises: arranging conductive particles in cavities of a mold to laminate a photo-curable adhesive layer of an adhesive film onto a surface of the mold, the surface having the conductive particles arranged thereon, the adhesive layer being supported on a peeling substrate; compressing the adhesive layer against the mold from the upper surface of the peeling substrate to push the adhesive layer into the cavities; peeling the adhesive film from the mold to make a part of the conductive particle exposed at a surface of the adhesive layer and adhered thereto and form a conductive particle-containing layer having a projection-and-depression pattern molded according to the mold; irradiating a front surface of the conductive particle-containing layer, the front surface having the projection-and-depression pattern, with light to cure the front surface; laminating the first insulating adhesive layer onto the front surface of the conductive particle- containing layer to make air bubbles contained between the conductive particle-containing layer and the first insulating adhesive layer; and laminating the second insulating adhesive layer onto a back surface of the conductive particle-containing layer, the back surface being opposite to the front surface of the conductive particle-containing layer.

A method for producing a connection body according to the present invention, the connection body being obtained by anisotropic conductive connection between a terminal of a first electronic component and a terminal of a second electronic component by using the above-mentioned anisotropic conductive film, comprises: temporarily adhering the first insulating adhesive layer of the anisotropic conductive film onto the first electronic component; temporarily mounting the second electronic component on the second insulating adhesive layer; and bonding by thermocompression or light irradiation from above the second electronic component.

A connection method according to the present invention is a connection method for anisotropic conductive connection between a terminal of a first electronic component and a terminal of a second electronic component by using the above-mentioned anisotropic conductive film, and comprises: temporarily sticking the first insulating adhesive layer of the anisotropic conductive film onto the first electronic component; temporarily mounting the second electronic component on the second insulating adhesive layer; and bonding by thermocompression or light irradiation from the second electronic component.

Effects of the Invention

According to the present invention, although a stress is generated in the anisotropic conductive film with cure shrinkage of adhesive components in each layer of the anisotropic conductive film, the warp of an electronic component can be reduced by the stress relaxation action of air bubbles contained between the conductive particle-containing layer and the first insulating adhesive layer.

DETAILED DESCRIPTION OF THE INVENTION

Hereinafter, with reference to the drawings, one embodiment of an anisotropic conductive film, a method for producing an anisotropic conductive film, a method for producing a connection body, and a connection method according to the present invention will be described by taking the case where the embodiment is applied to production of a liquid crystal display apparatus as an example. It should be noted that the present invention is not limited to the following embodiments, and it is a matter of course that various changes can be made within the scope not deviating from the gist of the present invention. Moreover, the drawings are just schematic and the ratio of each dimension and the like may be different from the actual ratio thereof. Specific dimensions and the like should be determined in consideration of the following description. Furthermore, it is a matter of course that there is sometimes a difference in the relation or ratio of dimension between the drawings.

[Liquid Crystal Display Apparatus]

A liquid crystal display apparatus which is a connection body produced using one embodiment of an anisotropic conductive film according to the present invention is configured such that an IC for liquid crystal driving is directly mounted on a substrate of a liquid crystal display panel by what is called COG (chip on glass) mounting, and a flexible substrate having a liquid crystal driving circuit formed therein is directly mounted on the substrate of the liquid crystal display panel by what is called FOG (film on glass).

Figure 1:
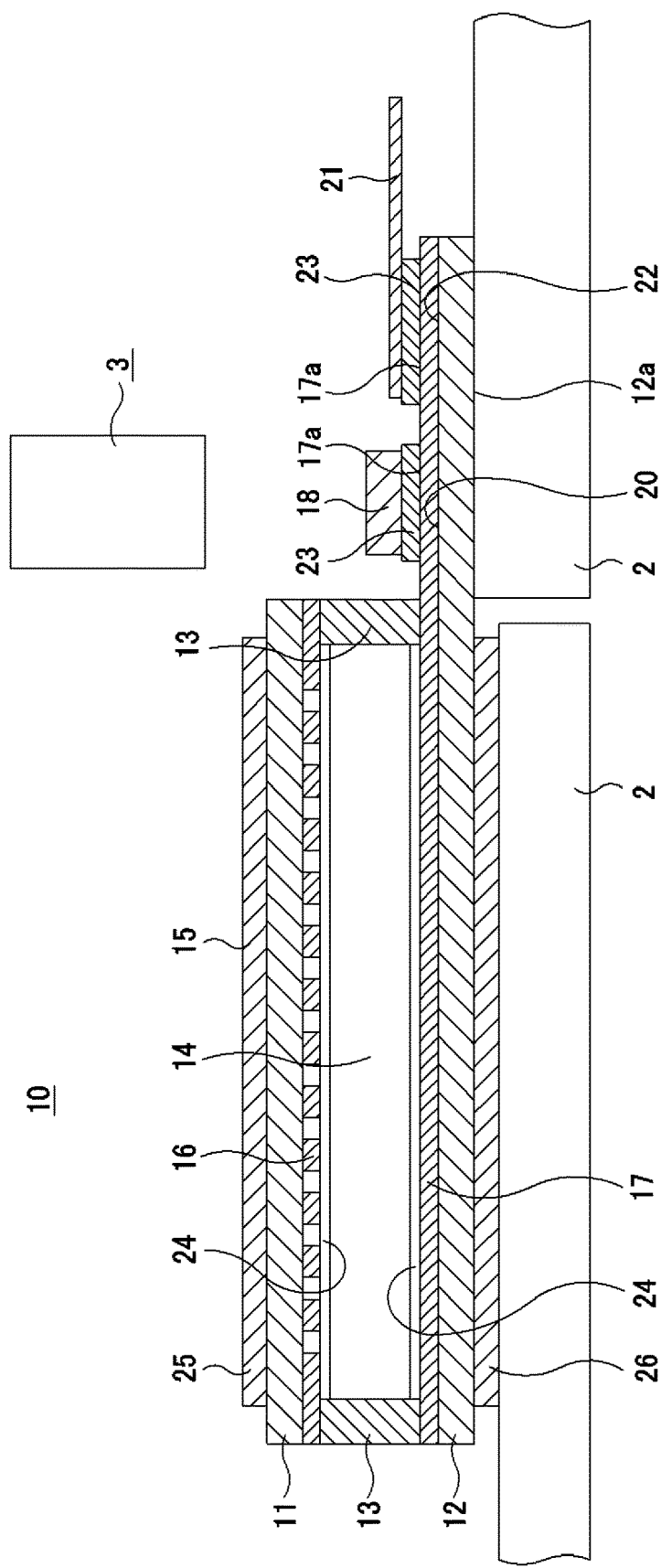
FIG. 1 is a cross-sectional view of a liquid crystal display apparatus using one embodiment of the anisotropic conductive film according to the present invention.

As illustrated in FIG. 1, the liquid crystal display apparatus has a liquid crystal display panel 10 configured to perform a main function for liquid crystal display. As is the case with the above-mentioned liquid crystal display panel 104, the liquid crystal display panel 10 is configured such that two transparent substrates 11, 12 made of a glass substrate or the like are disposed so as to face each other, and these two transparent substrates 11, 12 are stuck to each other by a frame-shaped seal 13. Furthermore, in the liquid crystal display panel 10, liquid crystal 14 is sealed in a space surrounded with the transparent substrates 11, 12 to form a panel display unit 15.

On the internal surfaces of the transparent substrate 11, 12, the internal surfaces facing each other, a pair of transparent electrodes 16, 17 made of ITO (indium tin oxide) or the like, having a stripe form are formed respectively so as to intersect each other. Furthermore, both of the transparent substrates 16, 17 are configured such that a picture element as a minimum unit of liquid crystal display is formed of the intersection portion of these transparent electrodes 16, 17.

Of the transparent substrates 11, 12, the one transparent substrate 12 is formed to have a larger plane size than the other transparent substrate 11, and, in an edge portion 12a of the transparent substrate 12 having a larger plane size, there is provided a COG mounting portion 20 on which an electronic component 18 such as an IC for liquid crystal driving is mounted, and furthermore, in the vicinity of the outside of the COG mounting portion 20, there is provided a FOG mounting portion 22 on which a flexible substrate 21 having a liquid crystal driving circuit formed therein is mounted.

It should be noted that the IC for liquid crystal driving circuit and the liquid crystal driving circuit are configured such that selective application of a liquid crystal driving voltage to the picture elements causes the orientation of liquid crystal to be partially changed, thereby allowing predetermined liquid crystal display to be achieved.

Each of the mounting portions 20, 22 is formed with a terminal portion 17a of the transparent electrode 17. The electronic component 18, such as IC for liquid crystal driving, and the flexible substrate 21 are thermocompression-bonded onto the terminal portion 17a via an anisotropic conductive film 23. The anisotropic conductive film 23 contains conductive particles and is configured to electrically connect the electrodes of the electronic component 18 and the flexible substrate 21 to the terminal portion 17a of the transparent electrode 17 via the conductive particles, the terminal portion 17a being formed in the edge portion 12a of the transparent substrate 12. This anisotropic conductive film 23 is a thermosetting adhesive, and, for example, is thermocompression-bonded by a later-mentioned thermocompression head 3, thereby being cured with the conductive particles being squashed, and connecting the transparent substrate 12 to the electronic component 18 and the flexible substrate 21.

In addition, on each of the transparent electrodes 16, 17, an orientated film 24 undergoing a predetermined rubbing process is formed, and the orientated film 24 is configured to allow the initial orientation of liquid crystal molecules to be controlled. Furthermore, a pair of polarizing plates 25, 26 are provided on the outside of the transparent substrates 11, 12, respectively, and these polarizing plates 25, 26 allow the vibration direction of transmitted light from a light source (not illustrated), such as a backlight, to be controlled.

[Anisotropic Conductive Film]

Figure 2:
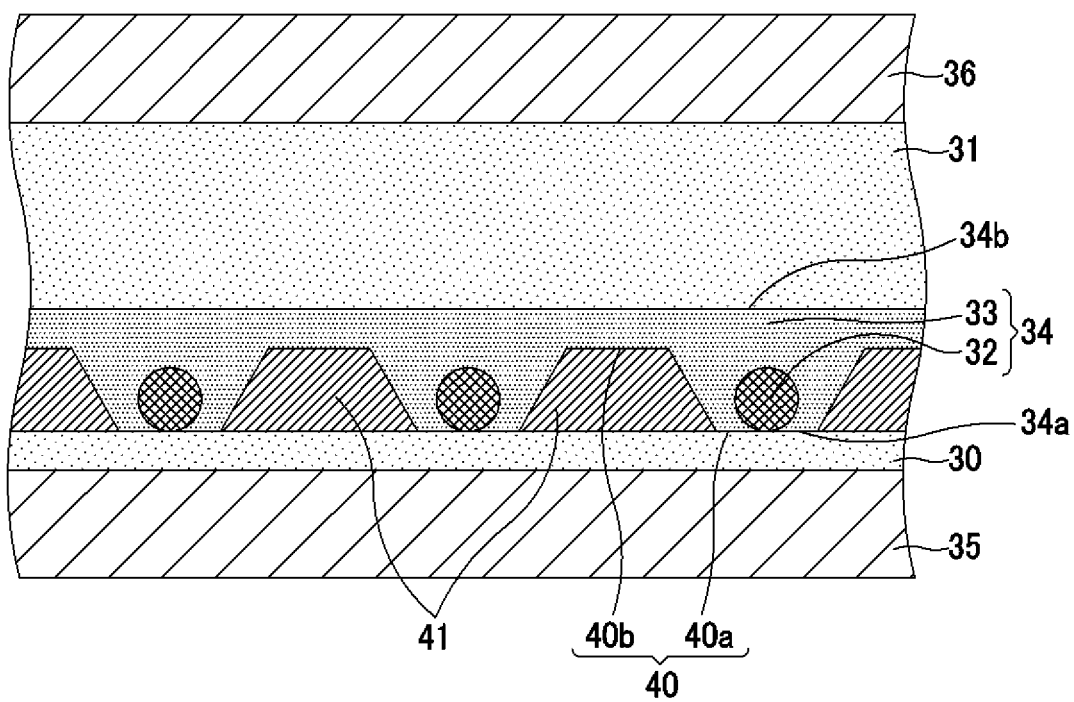
FIG. 2 is a cross-sectional view of the one embodiment of the anisotropic conductive film according to the present invention.

Next, the anisotropic conductive film 23 will be described. As illustrated in FIG. 2, the anisotropic conductive film 23 comprises a first insulating adhesive layer 30, a second insulating adhesive layer 31, and a conductive particle-containing layer 34 sandwiched by the first insulating adhesive layer 30 and the second insulating adhesive layer 31 and having conductive particles 32 contained in an insulating adhesive 33.

[First and Second Insulating Adhesive Layers]

Both of the first insulating adhesive layer 30 and the second insulating adhesive layer 31 are thermosetting adhesives and are formed such that an organic resin binder containing a film forming resin, a thermosetting resin, and a curing agent is supported on a peeling substrate 35, 36. Furthermore, the first insulating adhesive layer 30 and the second insulating adhesive layer 31 may be an adhesive having both thermosetting properties and photo-curable properties, or may be an adhesive having only photo-curable properties. Also in this case, well-known materials may be used as the film forming resin and the others. The same goes for the peeling substrates 35, 36.

The film forming resin is a polymeric resin having an average molecular weight of not less than 10000, and, from the viewpoint of film forming properties, the film forming resin preferably has an average molecular weight of approximately 10000 to 80000. Examples of the film-forming resin include various resins such as an epoxy resin, a phenoxy resin, a polyester urethane resin, a polyester resin, a polyurethane resin, an acrylic resin, a polyimide resin and a butyral resin, and these resins may be used alone or two types or more of these resins may be used in combination.

Among these resins, phenoxy resin is preferably used from the viewpoints of film formation state, connection reliability, and the like.

The thermosetting resin is not particularly limited, and examples of the thermosetting resin include commercially available epoxy resins, liquid epoxy resins having flowability at normal temperature, and acrylic resins.

Examples of the epoxy resin include bisphenol A type epoxy resin, bisphenol F type epoxy resin, novolak type epoxy resin, and various kinds of modified epoxy resins, such as rubber and urethane, and these resins may be used alone, or two types or more of these resins may be used in combination. Examples of the liquid epoxy resin include bisphenol type epoxy resin, naphthalene type epoxy resin, biphenyl type epoxy resin, phenol novolak type epoxy resin, stilbene type epoxy resin, triphenyl methane type epoxy resin, phenol aralkyl type epoxy resin, naphthol type epoxy resin, dicyclopentadiene type epoxy resin, and triphenyl methane type epoxy resin, and these resins may be used alone, or two types or more of these resins may be used in combination.

The acrylic resin is not particularly limited, and an acrylic compound, a liquid acrylate, or the like may be suitably selected in accordance with the intended use. Examples of the acrylic resin include methyl acrylate, ethyl acrylate, isopropyl acrylate, isobutyl acrylate, epoxy acrylate, ethylene glycol diacrylate, diethylene glycol diacrylate, trimethylolpropane triacrylate, dimethylol tricyclodecane diacrylate, tetra ethylene glycol tetraacrylate, 2-hydroxy-1,3-diacryloxypropane, 2,2-bis[4-(acryloxymethoxy)phenyl] propane, 2,2-bis[4-(acryloxyethoxy)phenyl]propane, dicyclopentenyl acrylate, tricyclodecanyl acrylate, tris(acryloxyethyl)isocyanurate, urethane acrylate, and epoxy acrylate. It is noted that examples thereof include resins obtained by methacrylation of the acrylates. These may be used alone or two types or more of these resins may be used in combination.

The curing agent is not particularly limited and nay be suitably selected in accordance with the intended use, and, for example, a latent curing agent activated by heat or light may be used. Examples of the latent curing agent include cationic curing agents such as a sulfonium salt, anionic curing agents such as polyamine and imidazole, and radical curing agents such as an organic peroxide.

As one other additive composition, a silane coupling agent is preferably added. Examples of the silane coupling agent include epoxy-based, amino-based, mercapto-sulfide-based and ureido-based silane coupling agents. Among these silane coupling agents, an epoxy silane coupling agent is preferably used in the present embodiment. That makes adhesiveness at an interface of an organic material and an inorganic material to be improved. Furthermore, an inorganic filler may be added. Examples of the inorganic filler include silica, talc, titanium oxide, calcium carbonate, and magnesium oxide, and the kind of the inorganic filler is not particularly limited. Flowability to be controlled and particle trapping efficiency to be improved depending to the content of the inorganic filler. Furthermore, a rubber component or the like may be suitably used for relaxation of the stress of a bonded body.

The first insulating adhesive layer 30 and the second insulating adhesive layer 31 are formed in such a manner that an organic resin binder obtained by dissolving the film forming resin, the thermosetting resin, the curing agent, and the one other additive in an organic solvent is coated onto the peeling substrates 35, 36, then the organic solvent is volatilized. It should be noted that, when the film forming resin, the thermosetting resin, the curing agent, and the one other additive are blended, as the organic solvent to dissolve them, toluene, ethyl acetate, or a mixed solvent thereof, and other various organic solvents may be used.

As the peeling substrates 35, 36, a substrate, such as a polyethylene terephthalate film, which has been commonly used for an anisotropic conductive film (ACF) may be used.

[Conductive Particle-Containing Layer]

The first insulating adhesive layer 30 and the second insulating adhesive layer 31 sandwich the conductive particle-containing layer 34. The conductive particle-containing layer 34 is an ultraviolet curable adhesive and contains a film forming resin, a thermosetting resin, a curing agent, and conductive particles 32.

As the film forming resin, the thermosetting resin, the curing agent, and the one other additive which are constituents of the conductive particle-containing layer 34, the same as those used for the above-mentioned first insulating adhesive layer 30 and second insulating adhesive layer 31 may be used.

Any well-known conductive particles used for an anisotropic conductive film can be mentioned as the conductive particles 32. Examples of the conductive particles 32 include particles of various metal and metal alloy such as nickel, iron, copper, aluminum, tin, lead, chromium, cobalt, silver and gold; particles obtained by coating the surfaces of particles of metal oxide, carbon, graphite, glass, ceramic, plastic, and the like, with metal; and particles obtained by further coating the surfaces of the above-mentioned particles with an insulating thin film. In the case of employing particles obtained by coating the surfaces of resin particles with metal, examples of the resin particles include epoxy resin particles, phenol resin particles, acrylic resin particles, acrylonitrile styrene (AS) resin particles, benzoguanamine resin particles, divinylbenzene-based resin particles and styrene-based resin particles.

In one surface 34a of the conductive particle-containing layer 34, the one surface 34a being in contact with the first insulating adhesive layer 30, a projection-and-depression pattern 40 is formed in accordance with a pattern of cavities 51 of a later-mentioned mold 50. The conductive particles 32 are disposed in projection portions 40a of the projection-and-depression pattern 40. That is, in the conductive particle-containing layer 34, the conductive particles 32 are regularly disposed in a single layer in accordance with the projection-and-depression pattern 40. Furthermore, the top portions of the conductive particles 32 are exposed at the projection portions 40a of the projection-and-depression pattern 40, thereby being in contact with the first insulating adhesive layer 30.

[Degree of Cure]

After the conductive particles 32 are transferred to the conductive particle-containing layer 34 as mentioned later, the one surface 34a of the conductive particle-containing layer 34 is irradiated with ultraviolet radiation beforehand, and then laminated by the first insulating adhesive layer 30. Therefore, in the conductive particle-containing layer 34, a curing reaction proceeds on the side of the one surface 34a. Furthermore, in the conductive particle-containing layer 34, a portion below the conductive particles 32, the portion being cut off from ultraviolet radiation, in other words, a portion on the side of the another surface 34b being in contact with the second insulating adhesive layer 31 rather than the conductive particles 32 has a lower degree of cure than other portions.

[Air Bubbles]

Air bubbles 41 are contained between the conductive particle-containing layer 34 and the first insulating adhesive layer 30. The air bubbles 41 allow an internal stress in the anisotropic conductive film 23 to be relaxed after connection of the electronic component 18 using the anisotropic conductive film 23, thereby preventing the warp of the transparent substrate 12. In other words, in the anisotropic conductive film 23, a stress is generated with cure shrinkage of adhesive components in each of the layers 30, 31, 34. However, the stress relaxation action of the air bubbles 41 contained between the conductive particle-containing layer 34 and the first insulating adhesive layer 30 enables the warp of the transparent substrate 12 to be reduced.

In such a case, the air bubbles 41 are preferably arranged in the vicinity of the conductive particles 32 and positioned not so as to be in contact with the conductive particles 32. This is related to the fact that a stress is likely to be concentrated on the conductive particle 32 at the time of the connection. When the air bubbles 41 are too close to the conductive particles 32, an abrupt change in stress may occur, and therefore, the air bubbles 41 are relatively preferably positioned so as to keep an appropriate distance from the conductive particles 32. The distance is preferably larger than 0.2 times, more preferably larger than 0.3 times the particle diameter of the conductive particle 32 which is in the closest vicinity of the air bubbles 41. In this case, an upper limit of the distance between the air bubbles 41 and the conductive particles 32 is not given because the conductive particles 32 are arranged and, with the distance between the conductive particles, the upper limit thereof changes. It should be noted that the here-mentioned distance between the air bubble 41 and the conductive particle 32 represents the shortest distance between the end portion of the air bubble 41 and the end portion of the conductive particle 32.

Furthermore, in the case where the distance between the nearest conductive particles 32 is not less than 2 times the particle diameter of the conductive particles 32, the distance between the conductive particle 32 and the air bubble 41 is preferably in the intermediate range of the distance between the nearest conductive particles 32. Also in this case, the air bubble 41 is preferably distant 0.2 times, more preferably distant 0.3 times the particle diameter from one of the nearest conductive particles 32. Furthermore, the air bubbles 41 are present in a middle region between the conductive particles 32 so as to be preferably distant 0.4 times or less, more preferably distant 0.3 times or less the distance between the particles from the midpoint of the region. It should be noted that, in this case, since the midpoint is regarded as a base point, the air bubbles 41 are distant up to 0.5 times the distance between the particles from the midpoint.

The air bubbles 41 are contained in such a manner that the one surface 34a of the conductive particle-containing layer 34 is cured by ultraviolet irradiation, and then the first insulating adhesive layer 30 is laminated thereon, whereby the air bubbles 41 are contained between the first insulating adhesive layer 30 and the depression portions 40b of the projection-and-depression pattern 40 formed in the one surface 34a. Furthermore, the air bubbles 41 are regularly contained between the conductive particle-containing layer 34 and the first insulating adhesive layer 30 in accordance with the arrangement of the depression portions 40b of the projection-and-depression pattern 40. At this time, a plurality of the air bubbles 41 and a plurality of the conductive particles 32 are mixed, but, the air bubbles 41 and the conductive particles 32 do not necessarily need to be arranged in such a way that the distances between the air bubbles 41 and the conductive particle 32 are equal to each other. Furthermore, a group of the air bubbles 41 may be present linearly or curvilinearly, or may be in a lattice in which such lines intersect each other. Furthermore, the distance between the air bubbles in such air bubble group may not be constant, and may be irregular.

It should be noted that, as the air bubbles 41, minute air bubbles having a minute size, namely, a maximum length of less than 1 µm are also included. In other words, the air bubbles 41 may be, for example, minute air bubbles having a maximum length of less than 1 µm, resulting from dispersion of bubbles having a size of not less than 1 µm by an external force at the time of the lamination or extension during a process of producing the anisotropic conductive film 23. Thus, even if the above-mentioned minute air bubbles occupy most of the air bubbles 41 contained in the anisotropic conductive film 23, the effects of the present invention by the air bubbles 41 are not impaired. Furthermore, in the case where the air bubbles 41 have a maximum length of more than 5 µm, such air bubbles 41 could sometimes lead to air entrainment due to resin flow at the time of connection and lead to the resulting void generation after the connection, and hence, the air bubbles 41 preferably has a maximum length of less than 5 µm.

In addition, in the case where the air bubbles 41 in the form of minute air bubbles are disposed in the vicinity of the conductive particles 32, the effects of stress relaxation by the air bubbles 41 are produced according to the arrangement. For example, in the case where the air bubbles 41 are unevenly distributed to four points in the vicinity of the conductive particle 32, the air bubbles 41 disperse and relax the internal stress of the anisotropic conductive film 23 at the four points. This makes the warp of the connection body to be reduced. It should be noted that, as mentioned above, as the air bubbles 41, minute air bubbles resulting from dispersion by the lamination and/or extension during the process of producing the anisotropic conductive film 23 are included, and therefore, the shape of the air bubbles 41 is not particularly limited.

Figure 3:
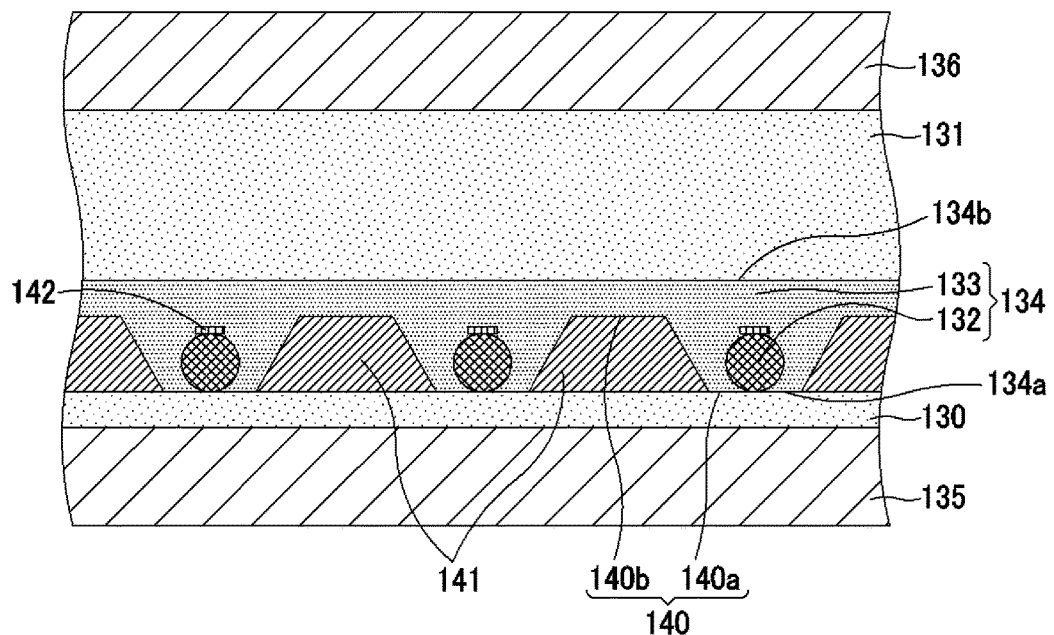
FIG. 3 is a cross-sectional view of another embodiment of the anisotropic conductive film according to the present invention.

Furthermore, another embodiment of the anisotropic conductive film 123 according to the present invention may have a configuration being such that, in order to secure the independence of the conductive particles 132 and prevent the occurrence of a short circuit, as illustrated in FIG. 3, a liquid composition 142 is provided between an insulating adhesive 133 and the conductive particles 132, each being contained in the conductive particle-containing layer 134. As the liquid composition 142, well-known resins, solvents, and the like are used. For example, in the case where a material which contributes to curing at the time of connection is used as the liquid composition 142, an epoxy resin having a low molecular weight and preferably being monofunctional or difunctional, or an acrylic monomer having a low molecular weight is employed as the material. On the other hand, in the case where a material which does not contribute to curing at the time of connection is used as the liquid composition 142, examples of the material include diluted, low-molecular-weight rubber and phenoxy resin, tackifiers having a molecular weight of hundreds to thousands, solvents having a boiling point of not less than 200° C., and leveling agents.

In the case where the material which contributes to curing at the time of connection is used as the liquid composition 142, the liquid composition 142 is cured at the time of connection, and therefore, the conductive particles 132 cannot easily move in the width direction of the anisotropic conductive film 123 illustrated in FIG. 3, whereby the independence of the conductive particles 132 after the connection is promoted. In other words, the use of the liquid composition 142 contributes to the prevention of interconnection of the conductive particles 132. On the other hand, in the case where the material which does not contribute to curing at the time of connection is used as the liquid composition 142, the use of the liquid composition 142 promotes the conductive particles 132 to move in the thickness direction of the anisotropic conductive film 123 illustrated in FIG. 3, thereby contributing to pushing the conductive particles 132 in. Therefore, the movement of the conductive particles 132 in the plane (lateral) direction (the width direction of the anisotropic conductive film 123 illustrated in FIG. 3) is relatively controlled. That is, whether the liquid composition 142 contributes to curing or not, the liquid composition 142 contributes to improvement in the electrical continuity property of a connection structure body.

In addition, the dispersion of the liquid composition 142 by an external force at the time of the lamination and/or extension, or at the time of the connection by the anisotropic conductive film 123 allows the liquid composition 142 to have the same effects as the air bubbles 141. That is, even bubbles considered to be formed of the liquid composition relax the internal stress of the anisotropic conductive film 123 in the same manner as the above-mentioned air bubbles 141. In other words, bubbles are not limited to the air bubbles 141, and bubbles formed of the liquid composition 142 are included. In the case of bubbles formed of the liquid composition 142, the bubbles are likely to touch the conductive particles 132 in view of a production process. However, unlike the air bubbles 141, bubbles formed of the liquid composition 142 are in liquid form, and hence, it is assumed that bubbles formed of the liquid composition 142 hardly cause the above-mentioned abrupt change in stress, and therefore, in this case, the connection state between the bubbles and the conductive particles 132 are not particularly limited.

It should be noted that a portion in which the liquid composition 142 is provided is not necessarily limited to a portion between the insulating adhesive 133 and the conductive particle 132 for reasons of the manufacturing process. For example, the liquid composition 142 may be provided in any of a portion between the first insulating adhesive layer 130 and the conductive particles 132 and a portion between the second insulating adhesive layer 131 and the conductive particles 132, and furthermore, in the case of providing the liquid composition 142, even if the liquid composition 142 is contained in the air bubbles 141, the same effects as those mentioned above are achieved. This is because the structure is occupied mainly by a resin having a high viscosity, whereby the mobility of the bubbles containing the liquid composition 142 relatively is high, and therefore, it is difficult to specify the position of the liquid composition 142.

[Process of Producing the Anisotropic Conductive Film]

Figure 4:
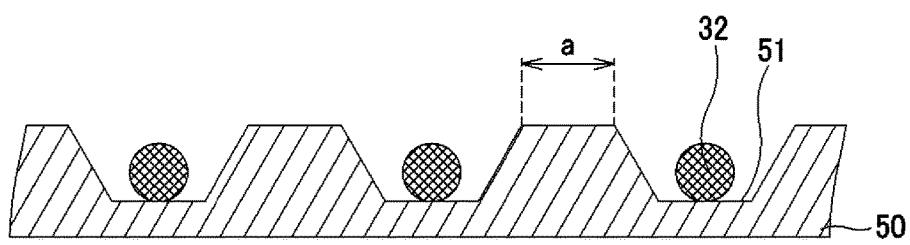
FIG. 4 is a cross-sectional view of a mold wherein conductive particles are arranged in a single layer in cavities.

Next, a method for producing the anisotropic conductive film 23 according to one embodiment of the present invention will be explained. First, a mold for arrangement of conductive particles is prepared. As the mold, for example, a mold 50 in which cavities 51 to be filled up with conductive particles are regularly formed as illustrated in FIG. 4 is employed. The mold 50 is filled up with the conductive particles 32 by using a squeegee or the like. The conductive particles 32 are thus arranged in a pattern on the surface of the mold 50 in accordance with the pattern of the cavities 51.

The mold 50 is made to have the cavities 51 arranged at intervals "a" of, for example, 3 to 6 µm. As mentioned later, the size of the air bubbles 41 contained between the conductive particle-containing layer 34 and the first insulating adhesive layer 30 is controlled according to the interval a of the cavities 51, and thus is 1 to 5 µm in accordance with the cavities 51 arranged at the intervals of 3 to 6 µm. It should be noted that, as mentioned above, the air bubbles 41 are sometimes minute bubbles having a maximum length of less than 1 µm because bubbles having a size of not less than 1 µm are dispersed by an external force at the time of the lamination and/or extension during the process of producing the anisotropic conductive film 23. Furthermore, adjusting the interval "a", the shape, and the like of the cavities 51 of the mold 50 makes the size of the air bubbles 41, namely, the maximum length thereof to be made not more than 1 µm.

Furthermore, in the mold 50, the cavities 51 are regularly arranged and formed in such a way that the diameter of each of the cavities 51 is slightly larger than the diameter of the conductive particles 32, and the depth of each of the cavities 51 is approximately the same as that of the conductive particles 32. Thus, when the mold 50 is filled up with the conductive particles 32, the conductive particles 32 are regularly arranged in a single layer accordingly.

Figure 5:
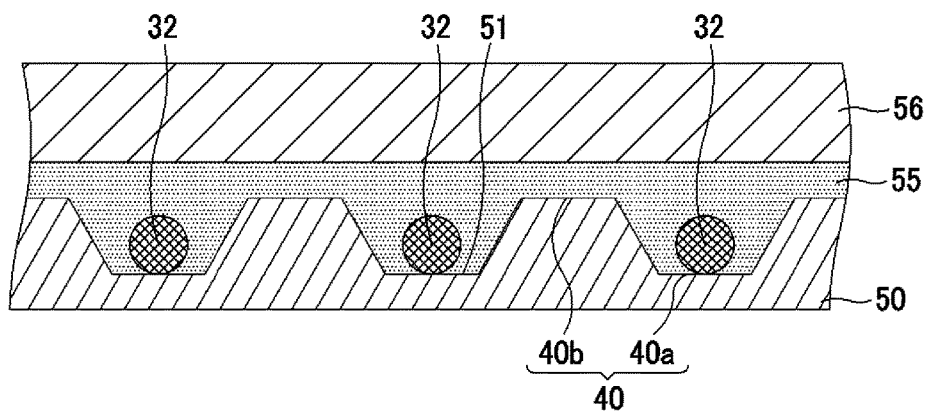
FIG. 5 is a cross-sectional view illustrating a state in which an adhesive layer is laminated in the mold.

As illustrated in FIG. 5, a photo-curable adhesive layer 55 is laminated onto a surface of the mold 50, the surface having the cavities 51 filled up with the conductive particles 32. The adhesive layer 55 is formed of an organic resin binder obtained by mixing the film forming resin, the thermosetting resin, the curing agent, and the one other additive, which constitute the above-mentioned conductive particle-containing layer 34, and supported on a peeling substrate 56. As the peeling substrate 56, a substrate which has been commonly used for an anisotropic conductive film (ACF), for example, a polyethylene terephthalate film may be used.

The adhesive layer 55 is compressed from the side of the peeling substrate 56 by a thermocompression head, thereby being laminated on one surface having the cavities 51 of the mold 50 formed thereon, and being pushed into the cavities 51. Thus, in the adhesive layer 55, the projection-and-depression pattern 40 according to the pattern of the cavities 51 is formed and further the conductive particles 32 filled in the cavities 51 are transferred to the projection portion 40a of the projection-and-depression pattern 40.

Figure 6:
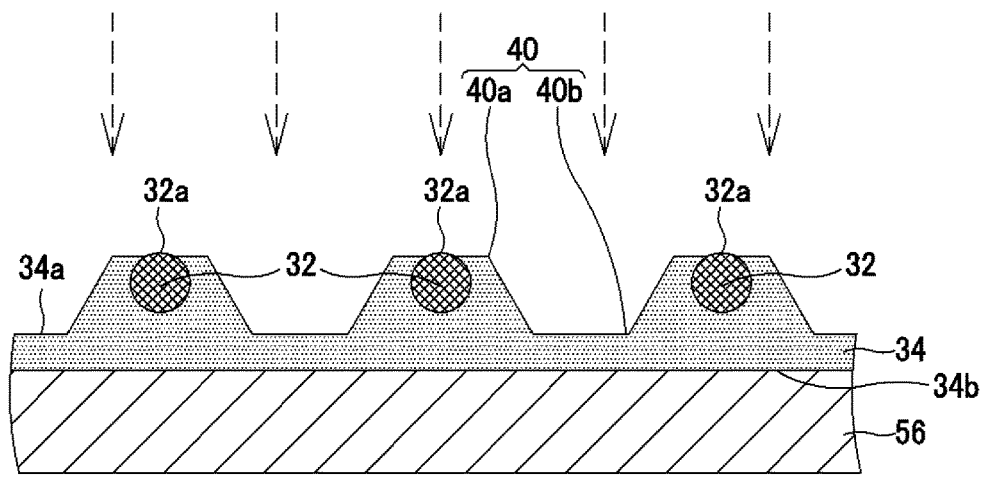
FIG. 6 is a cross-sectional view of a conductive particle-containing layer which is supported on a peeling substrate.

Next, the adhesive layer 55 is peeled off together with the peeling substrate 56 from the mold 50. Thus, as illustrated in FIG. 6, the uncured conductive particle-containing layer 34 supported on the peeling substrate 56 is formed. On one surface 34a of the conductive particle-containing layer 34, the one surface being opposite to a surface supported on the peeling substrate 56, the projection-and-depression pattern 40 is formed according to the pattern of the cavities 51.

To the projection portions 40a of the projection-and-depression pattern 40, the conductive particles 32 are transferred. A part 32a of the conductive particle 32 is exposed outward from the upper surface of the projection portion 40a. Moreover, in the projection-and-depression pattern 40, the depression portions 40b are formed in accordance with the interval of the cavities 51.

Subsequently, the conductive particle-containing layer 34 is irradiated with ultraviolet radiation from the side of the one surface 34a having the projection-and-depression pattern 40 formed thereon, and thereby cured. Here, in the conductive particle-containing layer 34, the back sides of the conductive particles 32 in the projection portions 40a are insufficiently irradiated with ultraviolet radiation, and accordingly, a portion located below the conductive particle 32, in other words, a portion on the side of another surface 34b below the conductive particles 32 is uncured.

Figure 7:
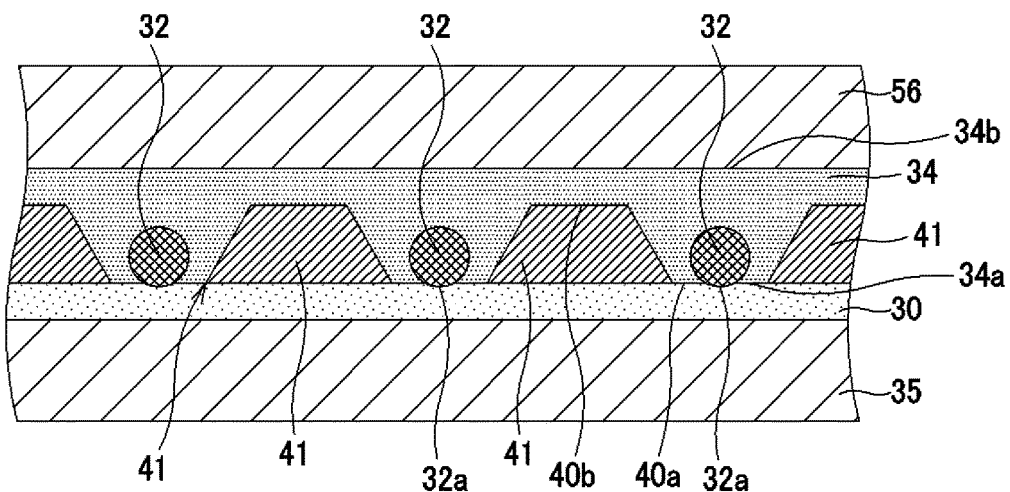
FIG. 7 is a cross-sectional view illustrating a state in which a first insulating adhesive layer is laminated onto a conductive particle-containing layer.

Next, as illustrated in FIG. 7, the first insulating adhesive layer 30 supported on the peeling substrate 35 is laminated onto the one surface 34a of the conductive particle-containing layer 34. At this time, since the conductive particle-containing layer 34 is cured by ultraviolet irradiation, when the lamination of the first insulating adhesive layer 30 thereto allow the air bubbles 41 to be contained between the depression portions 40b of the projection-and-depression pattern 40 and the first insulating adhesive layer 30. Furthermore, in the conductive particle-containing layer 34, a part 32a of the conductive particle 32, the part 32a being exposed from the projection portion 40a of the projection-and-depression pattern 40 can be made to touch the first insulating adhesive layer 30.

It should be noted that the position of the air bubbles 41 depends on the position of the projection portions 40a of the projection-and-depression pattern 40 of the mold 50, and therefore, the air bubbles 41 are positioned between the conductive particles 32. Hence, the air bubbles 41 are disposed in the vicinity of the conductive particles 32, but, disposed so as not to directly touch the conductive particles 32. Specifically, most of the air bubbles 41 are positioned outside the conductive particles 32 at a distance of approximately 0.2 to 0.3 times the outside diameter of the conductive particle 32 from the conductive particles 32. This presumably comes from the contact with the insulating adhesive 33 contained in the conductive particle-containing layer 34 and the peeling-off in the end portions of the cavities 51 of the mold 50. Therefore, the air bubbles 41 hardly adjoin the conductive particles 32, and a less amount of the air bubbles 41 is positioned in the vicinity of the conductive particles 32. That is, the proportion of the air bubbles 41 present between the conductive particles 32 is higher. However, in the case of the above-mentioned aspect in which liquid bubbles formed of the liquid composition 142 illustrated in FIG. 3 are contained, the liquid bubbles touch the conductive particles 132 in view of the feature of the production process.

Next, the peeling substrate 56 is peeled off, whereby the another surface 34b of the conductive particle-containing layer 34 is exposed, and the second insulating adhesive layer 31 supported on the peeling substrate 36 is laminated thereto. Thus, the anisotropic conductive film 23 is formed as illustrated in FIG. 2.

It should be noted that, in order to secure the independence of the conductive particles 132 and prevent the occurrence of a short circuit, when another embodiment of the anisotropic conductive film 123 according to the present invention is produced as illustrated in FIG. 3, the liquid composition 142 is coated to or sprayed on at least any one of a portion between the conductive particles 132 and the first insulating adhesive layer 130 and a portion between the conductive particles 132 and the insulating adhesive 133 of the conductive particle-containing layer 134. In the case where the liquid composition 142 is coated to or sprayed on a portion between the conductive particles 132 and the first insulating adhesive layer 130, after the filling of the conductive particles 132 into the mold 50 (see FIG. 4) and before the lamination by the insulating adhesive layer 130, the liquid composition 142 is coated or sprayed in trace amounts by which the liquid composition 142 does not reach the bottom of the mold 50. Thus, there is relaxed contact with the first insulating adhesive layer 130 and the insulating adhesive 133 in the edge portions of the cavities 51 of the mold 50.

Furthermore, in the case where the liquid composition 142 contributes to curing, the independence of the conductive particles 132 at the time of the curing is promoted, and accordingly the liquid composition 142 contributes to the prevention of interconnection of the conductive particles 132 at the time of the connection. On the other hand, in the case where the liquid composition 142 does not contribute to curing, the liquid composition 142 contributes to pushing-in of the conductive particles 132 at the time of the connection, and thus promotes the conductive particles 132 to move in the thickness direction of the anisotropic conductive film 123, and relatively, restricts the movement of the conductive particles 132 in the plane (lateral) direction of the anisotropic conductive film 123. That is, whether the liquid composition 142 contributes to curing or not, the liquid composition 142 contributes to improvement in the electrical continuity property of a connection structure body.

[Connection Process Using the Anisotropic Conductive Film]

Next, a connection process using the anisotropic conductive film 23 according to one embodiment of the present invention will be explained. In the case where the electronic component 18 is connected to the terminal portion 17a via the anisotropic conductive film 23, the peeling substrate 35 is peeled off first, then, the exposed first insulating adhesive layer 30 is disposed on the terminal portion 17a of the transparent electrode 17, and the anisotropic conductive film 23 is temporarily compression-bonded from the peeling substrate 36 by an unillustrated temporary compression bonding means.

Subsequently, the peeling substrate 36 is peeled off and the electronic component 18 is disposed on the anisotropic conductive film 23, and then, the thermocompression-bonding head 3 is made to generate heat while the electronic component 18 is compressed toward the side of the terminal portion 17a together with the anisotropic conductive film 23 by the thermocompression-bonding head 3 serving as a thermocompression-bonding means. The thermocompression by the thermocompression-bonding head 3 causes the first insulating adhesive layer 30 and the second insulating adhesive layer 31 in the anisotropic conductive film 23 to exhibit the flowability, whereby the first and the second insulating adhesive layers 30, 31 flow out from between the terminal portion 17a on the transparent substrate 12 and a connection terminal 18a of the electronic component 18.

Here, in the conductive particle-containing layer 34, the conductive particles 32 are exposed at the projection portion 40a and in contact with the first insulating adhesive layer 30, and therefore, when the first insulating adhesive layer 30 flows out, the conductive particles 32 touch the terminal portion 17a. Furthermore, in the conductive particle-containing layer 34, a portion thereof on the back side of the conductive particles 32 is insufficiently irradiated with ultraviolet radiation, thereby being uncured, and therefore, when the portion of the conductive particle-containing layer 34 is made to flow out together with the second insulating adhesive layer 31 by thermocompression using the thermocompression head 3, the conductive particles 32 also touch the connection terminal 18a of the electronic component 18.

Figure 8:
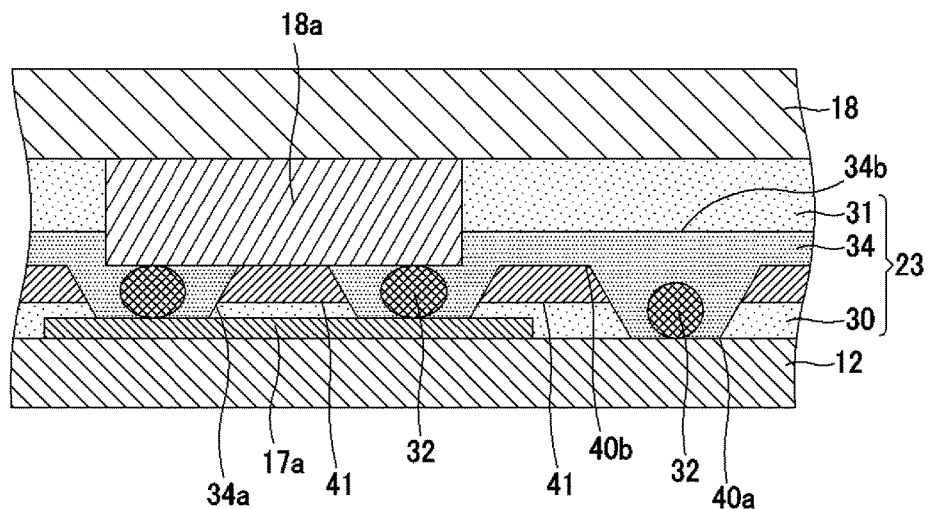
FIG. 8 is a cross-sectional view illustrating a connection state of an electronic component according to one embodiment of the anisotropic conductive film of the present invention.

Hence, as illustrated in FIG. 8, in the anisotropic conductive film 23, the conductive particles 32 are sandwiched by the terminal portion 17a on the transparent substrate 12 and the connection terminal 18a of the electronic component 18, and cured by heat in this sandwiched state. Thus, the electronic component 18 is electrically and mechanically connected to the terminal portion 17a via the anisotropic conductive film 23. It should be noted that the electric and mechanical connection of the terminal portion 17a on the transparent substrate 12 to the connection terminal 18a of the electronic component 18 is not limited to that by thermocompression. In other words, curing and bonding may be performed by the use of thermocompression and light irradiation in combination, or bonding may be performed only by light irradiation. Furthermore, there is no problem if temporary compression bonding is performed by curing by the use of light and heat in combination or by light irradiation.

At this time, the anisotropic conductive film 23 regularly contains the air bubbles 41 between the conductive particle-containing layer 34 and the first insulating adhesive layer 30 in accordance with the arrangement of the depression portions 40b, and therefore, even when an internal stress accompanied by cure shrinkage is generated between the electronic component 18 and the terminal portion 17a, the stress relaxation action of the air bubbles 41 allows warp in the transparent substrate 12 after the connection to be reduced. Thus, the occurrence of warp in the liquid crystal display panel 10 using the slimmed-down transparent substrate 12 is also prevented, whereby color irregularities can be reduced.

Furthermore, in the anisotropic conductive film 23, the conductive particles 32 are regularly arranged in a single layer in accordance with the projection-and-depression pattern 40, and therefore, compared to conventional anisotropic conductive films in which conductive particles are irregularly blended, the anisotropic conductive film 23 reduce as much as unnecessary conductive particles which do not contribute the electrical connection between the electronic component 18 and the terminal portion 17a possible. Furthermore, bubbles disposed in the vicinity of the conductive particles 32 cause stress relaxation to occur locally around the conductive particles 32, but, the conductive particles 32 per se are regularly arranged, and accordingly such regularity allows effects of stress relaxation to be uniformly achieved to the whole and the local generation of the stress relaxation to be controlled.

EXAMPLES

Next, examples of the anisotropic conductive film according to one embodiment of the present invention will be described. In the present examples, anisotropic conductive film samples (Examples 1 to 10) having different bubble-sizes and different curing systems of the insulating adhesive layer and anisotropic conductive film samples (Comparative Examples 1, 2) not containing air bubbles were prepared, and an IC chip was mounted on each of glass substrates provided with the samples, and then the amount of warp in each of the glass substrates and the electrical continuity resistance thereof were measured.

Any of the samples according to Examples and Comparative Examples is an anisotropic conductive film in which a conductive particle-containing layer is sandwiched by a first insulating adhesive layer and a second insulating adhesive layer, and, in each of the conductive particle-containing layers, a projection-and-depression pattern is formed on one surface in contact with the first insulating adhesive layer and also conductive particles are regularly arranged in a single layer in depression portions. However, the samples according to Examples contain air bubbles between the conductive particle-containing layer and the first insulating adhesive layer, on the other hand, the samples according to Comparative Examples do not contain air bubbles.

[Preparation of Conductive Particle-Containing Layer]

A conductive particle-containing layer was prepared in such a manner that an organic resin binder (50% solid content) having a composition indicated in the following Table 1 and Table 2 was coated to a PET film by a bar coater and underwent hot-air drying at 70° C. for 5 minutes to obtain an adhesive layer film having a thickness of 5 µm.

Figure 9:
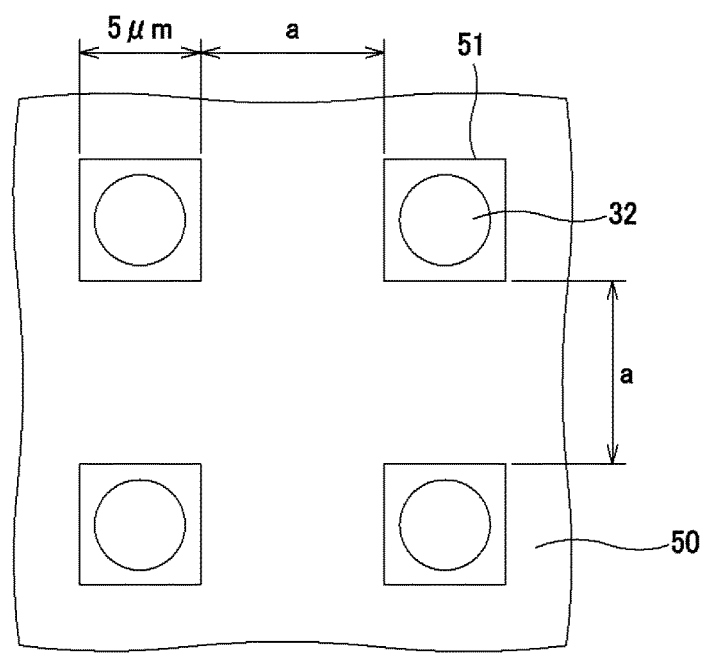
FIG. 9 is a plan view of the mold wherein the conductive particles are arranged in the cavities.
Figure 10:
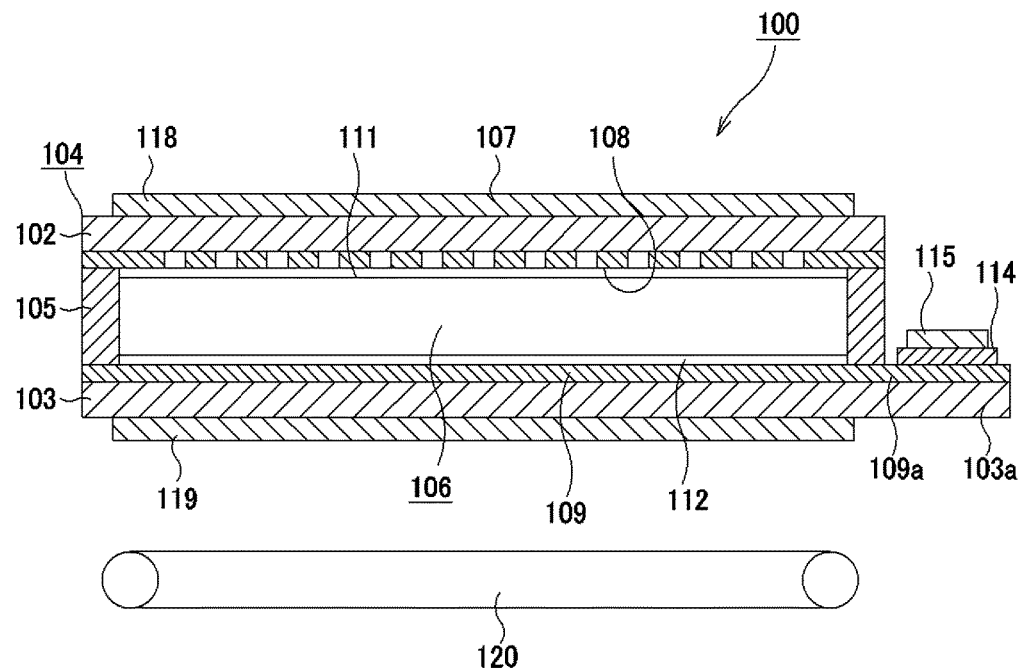
FIG. 10 is a cross-sectional view of a conventional liquid crystal display panel.
Figure 11:
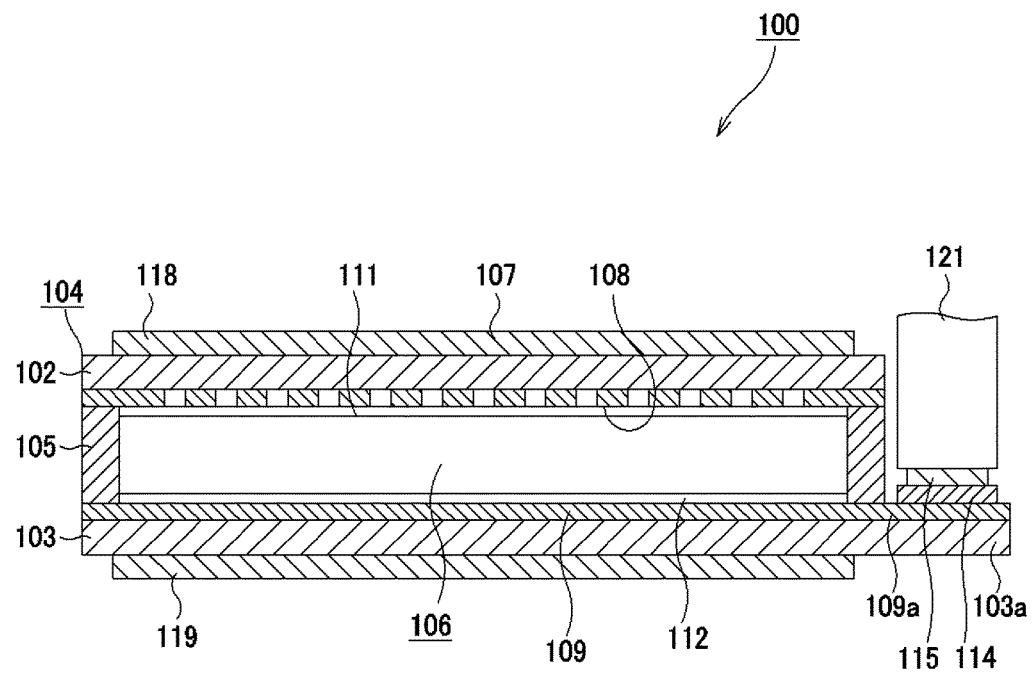
FIG. 11 is a cross-sectional view illustrating a conventional COG mounting process for the liquid crystal display panel.

Furthermore, in each of molds according to Examples and Comparative Examples, as illustrated in FIG. 9, cavities each 5 µm square and having a hole depth of 3 µm are regularly formed, and there are prepared three types of molds, namely, molds having an interval "a" of 3 µm between the cavities (Example 1 and Example 6), 4 µm (Examples 2, 4, 5, 7, 9, 10, Comparative Examples 1, 2), and 6 µm (Example 3 and Example 8). As the conductive particles to be filled in the cavity portions of each of the molds, Au-203A (average particle diameter of 3 µm) manufactured by SEKISUI CHEMICAL CO., LTD. was employed, and the conductive particles were filled using a squeegee.

Then, the adhesive layer film prepared earlier was laminated onto the mold filled with the conductive particles by a laminator having a roller surface temperature of 45° C., and then peeled from the mold. Thus, a projection-and-depression pattern according to the cavity pattern of the mold was formed in one surface of the adhesive layer film, and also the conductive particles were transferred to the projection portions. The conductive particles were regularly arranged in a single layer, and a part of each of the conductive particles was exposed to outside from the projection portion.

This adhesive layer film was irradiated with UV light having a wavelength of 365 nm and an integrated amount of light of 4000 mJ/cm$^2$ from the side of the one surface having the projection-and-depression pattern formed, whereby a conductive particle-containing layer was formed. In the conductive particle-containing layer, the one surface having the projection-and-depression pattern formed thereon was UV-cured, on the other hand, a portion on the back side of the conductive particles was irradiated with a smaller amount of UV, thereby being uncured.

[Preparation of Insulating Adhesive Layer]

An insulating adhesive layer was prepared in such a manner that an organic resin binder having a composition indicated in the following Table 1 and Table 2 was coated to a PET film using a bar coater and underwent hot-air drying at 80° for 3 minutes to obtain an adhesive layer film having a thickness of 5 µm.

A first insulating adhesive layer and a second insulating adhesive layer supported on the PET film were thus prepared.

[Lamination Process of Conductive Particle-Containing Layer and Insulating Adhesive Layer]

Next, the conductive particle-containing layer and the insulating adhesive layers were laminated, whereby a sample of the anisotropic conductive film was prepared. First, using a laminator having a roller surface temperature of 45° C., the first insulating adhesive layer was laminated onto one surface of the conductive particle-containing layer, the one surface having the projection-and-depression pattern formed thereon.

At this time, in Examples 1 to 5, the depression portions of the projection-and-depression pattern were made to contain air bubbles. On the other hand, in Comparative Examples 1 and 2, the lamination was performed so as to avoid air bubbles from being mixed in. Furthermore, in Examples 6 to 10, the lamination was performed likewise so as to make the depression portions contain minute air bubbles having a size of less than 1 µm.

Next, the PET film was peeled from another surface of the conductive particle-containing layer, the another surface being opposite to the one surface having the projection-and-depression pattern formed thereon, and then the second insulating adhesive layer was laminated by a laminator having a roller surface temperature of 45° C.

The anisotropic conductive film having a total thickness of 20 µm according to each of Examples and Comparative Examples was thus prepared.

[Characteristic Evaluation]

As an element for evaluation, an IC for evaluation was employed, the IC having:

Outer dimension: 1.8 mm×20 mm
Thickness: 0.5 mm
Outer dimension of Au-plated bump: 30 µm×85 µm
Height of Au-plated bump: 15 µm As a substrate for evaluation to which the IC for evaluation is to be connected, an ITO coating glass having a glass thickness of 0.7 mm was employed.

A connection body sample was formed in such a manner that the IC for evaluation was connected to the ITO coating glass by thermocompression via the anisotropic conductive film (35 mm×24 mm) according to each of Examples and Comparative Examples. The mounting conditions according to each of Examples and Comparative examples were as follows.

In Examples 1 to 3, Examples 6 to 8, and Comparative Examples 1, 2 (cationic curing system), the mounting were performed at 180° C. and 70 MPa for 5 seconds, and Teflon (registered trademark) having a thickness of 50 pm was interposed as a buffer between the thermocompression head and the IC for evaluation.

In Example 4 and Example 9 (anionic curing system), the mounting were performed at 200° C. and 70 MPa for 5 seconds, and Teflon (registered trademark) having a thickness of 50 µm was interposed as a buffer between the thermocompression head and the IC for evaluation.

In Example 5 and Example 10 (radical curing system), the mounting were performed at 160° C. and 70 MPa for 5 seconds, and Teflon (registered trademark) having a thickness of 50 µm was interposed as a cushioning material between the thermocompression head and the IC for evaluation.

To each of the above-mentioned connection body samples of Examples and Comparative Examples, a 2 mA current was applied by a 4-terminal method, and the connection resistance thereof was measured using a digital multimeter at the initial stage of the connection and after TCT (80° C., 85%, 250 hours). Furthermore, using a stylus type surface roughness measuring instrument (CL-830: manufactured by Kosaka Laboratory Ltd.), each of the connection body samples was scanned from the undersurface of the ITO coating glass serving as a substrate for evaluation, and the amount of warp (µm) in the ITO coating glass was measured before and after the connection of the ITO coating glass to the IC for evaluation, and the difference before and after the connection was calculated. Table 1 and Table 2 show measurement results.

TABLE 1

| | | Example 1 | Example 2 | Example 3 | Example 4 | Example 5 | Comparative Example 1 | Comparative Example 2 |
|---|---|---|---|---|---|---|---|---|
| Conductive particle-containing layer | Phenoxy resin (YP50: Nippon Steel Chemical Co., Ltd.) | 60 parts by mass | 60 parts by mass | 60 parts by mass | 60 parts by mass | 60 parts by triass | 60 parts by mass | 60 parts by mass |
| | Acrylate (EB600: DAICEL-CYTEC Co., Ltd.) | 40 parts by mass | 40 parts by mass | 40 part by mass | 40 parts by mass | 40 parts by mass | 40 parts by mass | 40 parts by mass |
| | Curing agent (IRGACURE 369: BASF) | 2 parts by mass | 2 parts by mass | 2 parts by mass | 2 parts by mass | 2 parts by mass | 2 parts by mass | 2 parts by mass |
| | Distance between cavities | 3 µm | 4 µm | 6 µm | 4 µm | 4 µm | 4 µm | 4 µm |
| Insulating adhesive layer | Phenoxy resin YP50: Nippon Steel Chemical Co., Ltd.) | 50 parts by mass | 50 parts by mass | 50 parts by mass | 50 parts by mass | 50 parts by mass | 50 parts by mass | 50 parts by mass |
| | Epoxy resin (EP828: Mitsui Chemicals, Inc.) | 40 parts by mass | 40 parts by mass | 40 parts by mass | 40 parts by mass | 40 parts by mass | 40 parts by mass | 40 parts by mass |
| | Stress relaxation agent (Grade 0589: JSR Corporation) | — | — | — | — | — | — | 10 parts by mass |
| Curing agent | San-Aid SI-60L: SANSHIN CHEMICAL INDUSTRY CO., LTD. | 10 parts by mass | 10 parts by mass | 10 parts by mass | — | — | 10 parts by mass | 10 parts by mass |
| | Novacure HX-3941HP: Asahi Kasei E-materials Corporation | — | — | — | 10 parts by mass | — | — | — |
| | PERBUTYL O: NOF CORPORATION | — | — | — | — | 10 parts by mass | — | — |
| Total thickness (after drying) (µm) | | 20 | 20 | 20 | 20 | 20 | 20 | 20 |
| Curing system of insulating adhesive layer | | Cationic system | Cationic system | Cationic system | Cationic system | Cationic system | Cationic system | Cationic system |
| Presence of conductive particle-comaining layer | | Present | Present | Present | Present | Present | Present | Present |
| Presence/absence of air bubbles | | Present | Present | resent | Present | Present | Absent | Absent |
| Air bubble size (µm) | | 1-2 | 2-3 | 4-5 | 2-3 | 2-3 | — | — |

TABLE 1-continued

|  |  | Example 1 | Example 2 | Example 3 | Example 4 | Example 5 | Comparative Example 1 | Comparative Example 2 |
|---|---|---|---|---|---|---|---|---|
|  | Addition of stress relaxation agent | Not added | Not added | Not added | Not added | Not added | Not added | Added |
| Warp amount (μm) | Intitial stage | 8 | 8 | 8 | 7 | 9 | 15 | 10 |
|  | After TCT (85° C., 85%, 250H) | 8 | 8 | 8 | 7 | 9 | 15 | 10 |
| Continuity resistance (Ω) | Initial stage | 0.3 | 0.3 | 0.3 | 0.3 | 0.3 | 0.3 | 0.3 |
|  | After TCT (85° C., 85%, 250H) | 5.8 | 6.0 | 6.0 | 6.0 | 6.0 | 6.0 | 10 |

TABLE 2

|  |  | Example 6 | Example 7 | Example 8 | Example 9 | Example 10 |
|---|---|---|---|---|---|---|
| Conductive particle-containing layer | Phenoxy resin (YP50: Nippon Steel Chemical Co., Ltd.) | 60 parts by mass | 60 parts by mass | 60 parts by mass | 60 parts by mass | 60 parts by triass |
|  | Acrylate (EB600: DAICEL-CYTEC Co., Ltd.) | 40 parts by mass | 40 parts by mass | 40 part by mass | 40 parts by mass | 40 parts by mass |
|  | Curing agent (IRGACURE 369: BASF) | 2 parts by mass | 2 parts by mass | 2 parts by mass | 2 parts by mass | 2 parts by mass |
|  | Distance between cavities | 3 μm | 4 μm | 6 μm | 4 μm | 4 μm |
| Insulating adhesive layer | Phenoxy resin YP50: Nippon Steel Chemical Co., Ltd.) | 50 parts by mass | 50 parts by mass | 50 parts by mass | 50 parts by mass | 50 parts by mass |
|  | Epoxy resin (EP828: Mitsui Chemicals, Inc.) | 40 parts by mass | 40 parts by mass | 40 parts by mass | 40 parts by mass | 40 parts by mass |
|  | Stress relaxation agent (Grade 0589: JSR Corporation) | — | — | — | — | — |
| Curing agent | San-Aid SI-60L: SANSHIN CHEMICAL INDUSTRY CO., LTD. | 10 parts by mass | 10 parts by mass | 10 parts by mass | — | — |
|  | Novacure HX-3941HP: Asahi Kasei E-materials Corporation | — | — | — | 10 parts by mass | — |
|  | PERBUTYL O: NOF CORPORATION | — | — | — | — | 10 parts by mass |
| Total thickness (after drying) (μm) |  | 20 | 20 | 20 | 20 | 20 |
| Curing system of insulating adhesive layer |  | Cationic system | Cationic system | Cationic system | Cationic system | Cationic system |
| Presence of conductive particle-comaining layer |  | Present | Present | Present | Present | Present |
| Presence/absence of air bubbles |  | Present | Present | resent | Present | Present |
| Air bubble size (μm) |  | 1> | 1> | 1> | 1> | 1> |
| Addition of stress relaxation agent |  | Not added | Not added | Not added | Not added | Not added |
| Warp amount (μm) | Intitial stage | 7.6 | 7.8 | 6.7 | 6.7 | 8.5 |
|  | After TCT (85° C., 85%, 250H) | 7.6 | 7.8 | 6.7 | 6.7 | 8.5 |
| Continuity resistance (Ω) | Initial stage | 0.3 | 0.3 | 0.3 | 0.3 | 0.3 |
|  | After TCT (85° C., 85%, 250H) | 5.8 | 6 | 6 | 6 | 6 |

As shown in Table 1, according to any of the present Examples, the depression portions of the projection-and-depression pattern of the conductive particle-containing layer were made to contain air bubbles, and therefore the internal stress generated at a connection point after the connection to the IC for evaluation was relaxed. Therefore, the amount of warp at the initial stage of the connection and after the TCT was controlled, and also the electrical continuity resistance after the TCT was controlled up to 6.0Ω, and good electrical continuity resistance was thus achieved.

On the other hand, in Comparative Example 1, air bubbles were not contained, and accordingly, an action to relax the internal stress generated at the connection point to the IC for evaluation did not work, whereby the amount of warp at the initial stage of the connection was larger, namely, 15 μm. Furthermore, in Comparative Example 2, although the stress relaxation agent was added, compared to Examples 1 to 5, each containing air bubbles, the amount of warp at the initial stage of the connection was larger, namely, 10 μm, and hence the effect of reducing the warp was smaller. Furthermore, in Comparative Example 2, the addition of the stress relaxation agent causes reduction in the aggregation force of the adhesive component, thereby causing lower connection reliability and higher electrical continuity resistance after the TCT, namely, 10Ω.

In Example 4, the amount of warp was slightly smaller. This is considered because, in Example 4, an anionic system was employed in place of the cationic system used in Example 2 and the curing rate by the anionic system is slower than that by the cationic system. Furthermore, in Example 5, a radical system as employed in place of the cationic system used in Example 2, and accordingly, although the radical system exhibited excellent low temperature rapid-curability, the amount of warp was slightly increased.

Furthermore, as shown in Table 2, according to any of Examples 6 to 10, minute air bubbles were contained in the depression portions of the projection-and-depression pattern of the conductive particle-containing layer and between the conductive particles and the first insulating adhesive layer, and therefore, compared to Examples 1 to 5, the internal stress generated at the connection point after the connection to the IC for evaluation was more relaxed. In other words, it was found that minute air bubbles led to the somewhat smaller amount of warp than large air bubbles and allowed the internal stress generated at the connection point to be more relaxed. This is considered because the use of minute bubbles as the air bubbles led to the presence of more bubbles having a relaxation action on the internal stress, hereby the effect of dispersing the stress was more increased.

Furthermore, as is the case with Example 4, the amount of warp was slightly smaller in Example 9. This is considered because, in Example 9, an anionic system was employed in place of the cationic system used in Example 7, and the curing rate by the anionic system is slower than that by the cationic system. Furthermore, in Examples 5 and 10, a radical system was employed in place of the cationic system used in Examples 2 and 7, and accordingly, although the radical system exhibited excellent low temperature rapid-curability the amount of warp was slightly increased.

REFERENCE SYMBOLS

1 . . . liquid crystal display apparatus, 3 . . . thermocompression head, 10 . . . liquid crystal display panel, 11, 12 . . . transparent substrate, 12a, . . . edge portion, 16, 17 . . . transparent electrode, 17a . . . terminal portion, 18 . . . electronic component, 18a . . . connection terminal, 20 . . . COG mounting portion, 23, 123 . . . anisotropic conductive film, 30, 130 . . . first insulating adhesive layer, 31, 131 . . . second insulating adhesive layer, 32, 132 . . . conductive particles, 33, 133 . . . insulating adhesive, 34, 134 . . . conductive particle-containing layer, 34a, 134a . . . one surface, 34b, 134b . . . another surface, 35, 36, 135, 136 . . . peeling substrate, 40, 140 . . . projection-and-depression pattern, 40a, 140a . . . projection portion, 40b, 140b . . . depression portion, 41, 141 . . . air bubble, 50 . . . mold, 51 . . . cavity, 55 . . . adhesive layer, 56 . . . peeling substrate, 142 . . . liquid composition.

The invention claimed is:

1. A method for producing a connection body, the connection body being obtained by anisotropic conductive connection between a terminal of a first electronic component and a terminal of a second electronic component by using an anisotropic conductive film, the anisotropic conductive film comprising:
a first insulating adhesive layer; and
a conductive particle-containing layer laminated on the first insulating adhesive layer and having conductive particles each contained independently in an insulating adhesive;
wherein air bubbles are contained between the conductive particle-containing layer and the first insulating adhesive layer, and
wherein the air bubbles are contained in accordance with the conductive particles, the method comprising curing the anisotropic conductive film in a sandwiched state of sandwiching the anisotropic conductive film between the first electronic component and the second electronic component.

2. A connection body obtained by anisotropic conductive connection between a first electronic component and a second electronic component by using an anisotropic conductive film, the anisotropic conductive film comprising:
a first insulating adhesive layer; and
a conductive particle-containing layer laminated on the first insulating adhesive layer and having conductive particles each contained independently in an insulating adhesive;
wherein air bubbles are contained between the conductive particle-containing layer and the first insulating adhesive layer, and
wherein the air bubbles are contained in accordance with the conductive particles.

3. The connection body according to claim 2, wherein, the conductive particle-containing layer has the conductive particles regularly arranged in a single layer.

4. The connection body according to claim 2, wherein a part of the conductive particles is exposed at an interface surface between the conductive particle-containing layer and the first insulating adhesive layer.

5. The connection body according to claim 2, wherein the conductive particle-containing layer is a photo-curable adhesive layer.

6. The connection body according to claim 2, wherein the air bubbles have a size of less than 5 µm.

7. The connection body according to claim 2, wherein, in the conductive particle-containing layer, a portion containing the conductive particle has a larger thickness than a portion between the conductive particles.

8. The connection body according to claim 2, further comprising a second insulating layer,
wherein the conductive particles are sandwiched between the first insulating adhesive layer and the second insulating adhesive layer.

9. The connection body according to claim 8, wherein the curing system of the first and second insulating adhesive layers is one of a cationic curing system, an anionic curing system and a radical curing system.

10. The connection body according to claim 8, wherein a liquid composition is provided in any one of a portion between the first insulating adhesive layer and the conductive particle and a portion between the second insulating adhesive layer and the conductive particle.

11. The connection body according to claim 10, wherein the liquid composition is contained in the air bubbles.

12. The connection body according to claim 2, wherein, in the conductive particle-containing layer, a portion thereof below the conductive particles has a lower degree of cure than other portions thereof.

13. The connection body according to claim 2, wherein the conductive particles are regularly arranged as viewed from a planar perspective, and the air bubbles are regularly contained in accordance with the conductive particles.

14. The connection body according to claim 2, wherein the conductive particles and the air bubbles are present on one surface.

15. The connection body according to claim 13, wherein the conductive particles are regularly arranged in a single layer and the air bubbles are present in an intermediate region between adjacent conductive particles.

16. The connection body according to claim 13, wherein the conductive particle-containing layer has the conductive particles regularly arranged in a single layer and the air bubbles are present in a vicinity of adjacent conductive particles.

17. The connection body according to claim 2, wherein the air bubbles include air bubbles having a maximum length of less than 1 µm.

18. The connection body according to claim 17, wherein the air bubbles form a group.

19. A display apparatus comprising a connection body in which a substrate and an electronic component are connected by anisotropic conductive connection using the method of claim 1.

20. A display apparatus comprising a connection body obtained by anisotropic conductive connection according to claim 2.

\* \* \* \* \*